United States Patent [19]
Krijn et al.

[11] Patent Number: 5,838,011
[45] Date of Patent: Nov. 17, 1998

[54] CORRECTION DEVICE FOR THE CORRECTION OF LENS ABERRATIONS IN PARTICLE-OPTICAL APPARATUS

[75] Inventors: Marcellinus P.C.M. Krijn; Alexander Henstra; Karel D. Van Den Mast, all of Eindhoven, Netherlands

[73] Assignee: U.S. Philips Corporation, New York, N.Y.

[21] Appl. No.: 861,345

[22] Filed: May 21, 1997

[30] Foreign Application Priority Data

May 21, 1996 [EP] European Pat. Off. ............... 96201381

[51] Int. Cl.$^6$ .................................................. H01J 37/153
[52] U.S. Cl. ......................................................... 250/396 R
[58] Field of Search .......................................... 250/396 R

[56] References Cited

U.S. PATENT DOCUMENTS

| | | | |
|---|---|---|---|
| 4,962,313 | 10/1990 | Rose | 250/396 R |
| 5,084,622 | 1/1992 | Rose | 250/396 R |
| 5,221,844 | 6/1993 | Van Der Mast et al. | 250/396 R |
| 5,336,891 | 8/1994 | Crewe | 250/396 R |

FOREIGN PATENT DOCUMENTS

0373399B1   6/1990   European Pat. Off. ....... H01J 37/153

Primary Examiner—Jack I. Berman
Attorney, Agent, or Firm—Dellett and Walters; Michael O. Scheinberg

[57] ABSTRACT

Particle-optical rotationally-symmetrical lenses inevitably exhibit spherical and chromatic aberration. These lens aberrations usually determine the limit of the resolution of the known particle-optical apparatus. Said lens aberrations cannot be eliminated by compensation by means of rotationally-symmetrical fields. In order to enhance the resolution of particle-optical apparatus nevertheless, it is proposed to reduce said lens aberrations by means of a "Wien-type" corrector. Such a configuration must satisfy very severe requirements as regards manufacturing precision, mechanical stability (inter alia with a view to thermal drift), alignment of the various elements relative to one another, and stability of the electric currents and voltages for the excitation of the electric and magnetic poles. Because the known correction device is composed of a number of separate components, it is extremely difficult to satisfy the requirements as regards manufacturing precision, mechanical stability and alignment simultaneously for all of these components. In the corrector in accordance with the invention said requirements in respect of mechanical stability and precision are satisfied in a simpler manner in that the pole faces determining hexapole fields are arranged adjacent one another without other particle-optical elements being arranged therebetween.

12 Claims, 4 Drawing Sheets

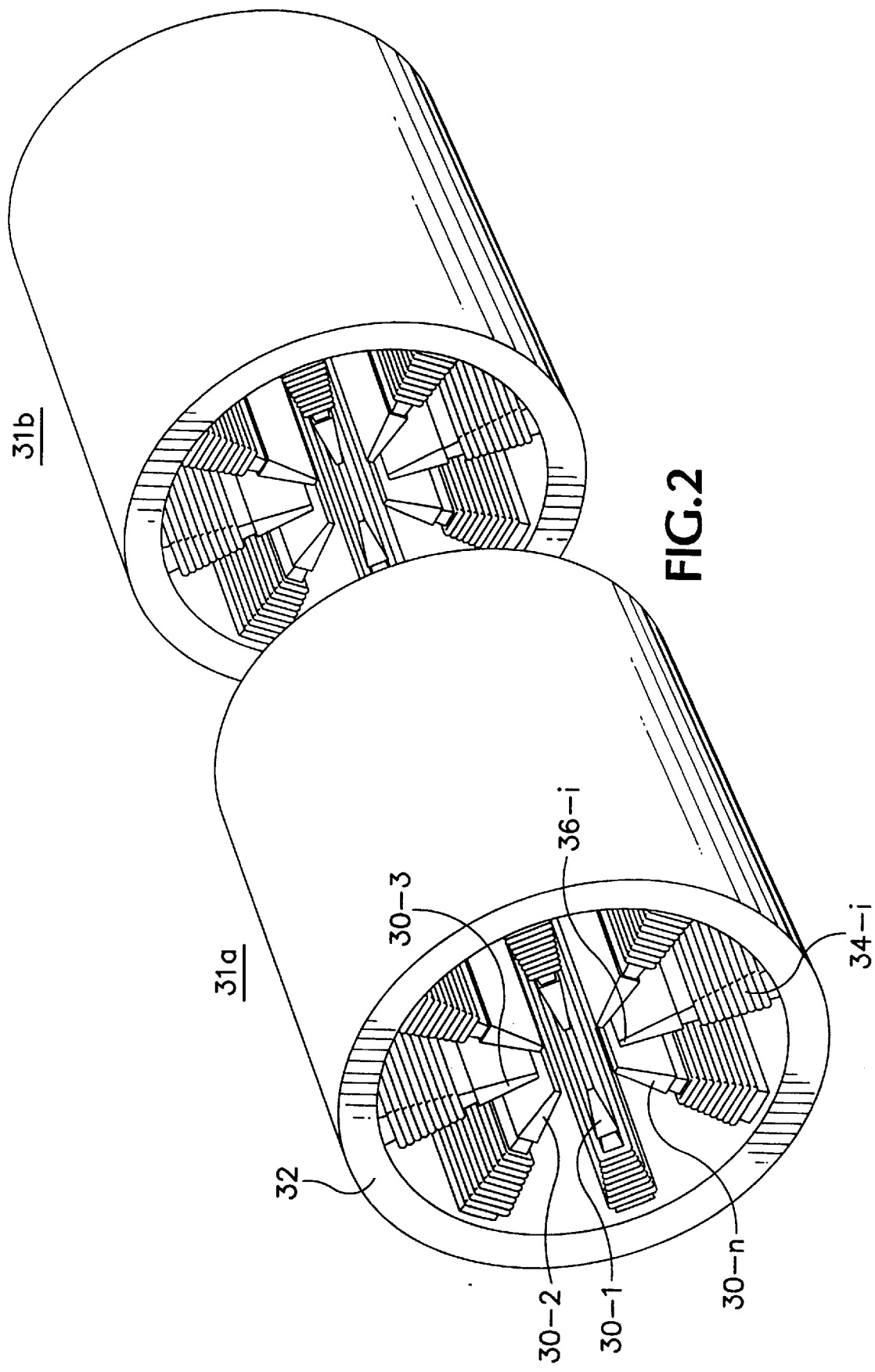

CORRECTION DEVICE FOR THE CORRECTION OF LENS ABERRATIONS IN PARTICLE-OPTICAL APPARATUS

The invention relates to a particle-optical apparatus, including:
a particle source for producing a beam of electrically charged particles which travel along an optical axis of the apparatus in order to expose an object to be irradiated in the apparatus to the particle beam,
a focusing lens for focusing the beam of electrically charged particles,
and a correction device for the correction of lens aberrations of the focusing lens,
which correction device includes pole faces for producing a uniform electric field and a uniform magnetic field which extends perpendicularly thereto, both dipole fields also extending perpendicularly to the optical axis of the apparatus,
which correction device also includes pole faces for producing electric and magnetic quadrupole fields, hexapole fields and an electrical and/or magnetic octupole field, said pole faces extending substantially parallel to the optical axis of the apparatus,
and which correction device is also arranged to produce at least two additional hexapole fields which form part of said hexapole field and have been rotated 180° about the optical axis relative to one another.

The invention also relates to a correction device for use in such an apparatus.

A correction device of this kind for use in such an apparatus is known from European Patent No. 0 373 399.

Particle-optical apparatus, such as electron microscopes or apparatus for electron lithography, are generally arranged to irradiate an object to be studied or worked by means of a beam of electrically charged particles (usually an electron beam) which is produced by a particle source such as a thermic electron source or an electron source of the field emission type. Object irradiation may be aimed at imaging such objects to be studied in such apparatus (samples in electron microscopes) or at forming very small structures on the object, for example, for microelectronics (apparatus for electron lithography). In both cases focusing lenses are required for the focusing of the electron beam.

The electron beam can in principle be focused in two ways. According to a first possibility, a sample to be examined is more or less uniformly exposed by the electron beam and an enlarged image of the sample is formed by means of the focusing lens. The focusing lens is in that case the objective lens of an imaging lens system; the resolution of the objective lens then governs the resolution of the apparatus. Apparatus of this kind are known as Transmission Electron Microscope (TEM). According to a second focusing possibility, the emissive surface of the electron source or, a part thereof, is imaged, generally, at a strongly reduced scale on the sample to be examined (in the Scanning Electron Microscope or SEM) or on an object on which the microstructure is to be provided (in the lithography apparatus). The image of the electron source (the "spot" which is displaced across the object by means of, for example deflection coils) is again formed by means of an imaging lens system. In the latter case the focusing lens is the objective lens of the spot-forming lens system; the resolution of this objective lens governs the spot size of the beam, and hence the resolution of the apparatus.

The lenses used in all of the above apparatus are usually magnetic lenses, but may also be electrostatic lenses. Both types of lens are practically always rotation-symmetrical lenses. Such lenses inevitably have a non-ideal behavior, i.e. exhibit lens aberrations, among which the so-called spherical aberration and the chromatic aberration are usually decisive as regards the lens resolution; these lens aberrations thus determine the limit of the resolution of the known electron-optical apparatus. According to a basic theorem in particle optics, said lens aberrations cannot be eliminated by compensation by means of rotation-symmetrical electric or magnetic fields.

In order to enhance the resolution of the particle-optical apparatus nevertheless, the cited European Patent No. 0 373 399 proposes to reduce said lens aberrations by means of a correction device having a non-rotationally-symmetrical structure. This structure is formed by a "Wien-type" corrector, i.e. a structure in which a uniform electric field and a uniform magnetic field, extending perpendicularly thereto, both extend perpendicularly to the optical axis of the apparatus. For the correction of the spherical aberration as well as the chromatic aberration, the proposed corrector includes a number of multipoles, i.e. an electric and a magnetic quadrupole, an electric and a magnetic hexapole, and an electric and/or a magnetic octupole. Thus, it may occur that only the electric field or only the magnetic field of the octupole fields is present.

An embodiment of the correction device disclosed in the cited European Patent Application (in FIG. 4 and the associated description) enables correction of the chromatic aberration as well as of the spherical aberration. This embodiment consists of a system of two identical multipole units wherebetween two rotationally symmetrical lenses are arranged. Each multipole unit is formed by a number of electric and magnetic poles whose pole faces are axially oriented, i.e. parallel to the optical axis of the apparatus. Each of said poles can be individually excited; when the individual excitations are suitably chosen, such a multipole unit is capable of forming, as desired, a uniform electric field extending perpendicularly to the optical axis and a uniform magnetic field extending perpendicularly thereto; both fields extend perpendicularly to the optical axis and thereon electric and magnetic quadrupole fields, hexapole fields and an electric and/or a magnetic octupole field can be superposed. The hexapole fields in this known correction device are of different strength and of opposite sign. This means that the hexapole field in the known correction device may be considered to be composed of a constant part and two additional hexapole fields which are added thereto and have been rotated 180° about the optical axis relative to one another.

Such a configuration must satisfy very severe requirements in respect of manufacturing precision, mechanical stability (inter alia in relation to thermal drift), alignment of the various elements relative to one another, and stability of the electric currents and voltages for the excitation of the electric and magnetic poles. Because the known correction device is composed of a number of separate components, it is extremely difficult to satisfy the requirements as regards manufacturing precision, mechanical stability and alignment for all of said components simultaneously.

It is an object of the invention to provide a particle-optical apparatus of the kind set forth in which said requirements regarding mechanical stability and precision can be more easily satisfied. To achieve this, the particle-optical apparatus in accordance with the invention is characterized in that the pole faces which determine the additional hexapole fields are arranged adjacent one another without other particle-optical elements being arranged therebetween.

The invention is based on the recognition of the fact that for the various multipoles in the correction device an excitation can be found where the chromatic as well as the spherical aberration are corrected and where it is not necessary to use two round intermediate lenses and hence two separate multipole units. The correction device can now be constructed as one mechanical unit in which, after manufacture, a physical separation is made in the poles generating the hexapole field. Viewed in the direction of the optical axis, this results in a hexapole field configuration consisting of a constant hexapole field and two additional hexapole fields. The additional hexapole fields have been rotated 180° about the optical axis relative to one another by suitable excitation of the electric and magnetic poles; in other words, they are oppositely directed. Because the correction device is now manufactured as one mechanical unit, only one component need be aligned with respect to the optical axis of the apparatus and the dimensional deviations due to manufacturing tolerances are substantially smaller than in the case of separate manufacture of the components.

An additional advantage of the described steps consists in that in the correction device in accordance with the invention two elements less need be excited (i.e. the two rotationally-symmetrical lenses arranged between the two multipole units) in comparison with the known correction device. This makes adjustment of the correction device in accordance with the invention less complex.

In a further embodiment of the invention, dipole fields and quadrupole fields of the correction device have a strength such that the trajectory of the electrically charged particles traveling along the optical axis of the apparatus is shaped as sine with substantially one period.

At the fields strengths thus adjusted the excitation current and/or the excitation voltage for generating the fields are valued so that they are as small as possible in comparison with the situation in which the trajectory of the beam traveling along the optical axis of the apparatus is shaped as a sine with several periods. In such a situation the stability of the currents and/or voltages to be adjusted is maximum.

In a further embodiment of the invention the length of the pole faces determining a first additional hexapole field equals, viewed in the direction of the optical axis, that of the pole faces determining a second additional hexapole field.

The latter steps offer the advantage that for the excitation of the additional hexapoles it suffices in principle to use only one power supply which can be electronically connected from the set of poles determining the one additional hexapole to the set of poles determining the other additional hexapole. A deliberate change of the excitation then causes equal changes of the excitation in both sets. Any (small) mechanical deviations, moreover, can then be compensated by means of a simple supply source for a comparatively small current and/or voltage.

When the particle-optical apparatus is a scanning particle-optical apparatus with a spot-forming objective lens, the correction device is preferably arranged so as to precede the objective lens, viewed from the particle source. The correction device can then be arranged as closely as possible to the objective lens, so that any residual aberrations are not unnecessarily enlarged by the distance between the correction device and the objective. If necessary, a set of deflection coils for the scanning motion of the beam can then be arranged between the correction device and the objective; however, these coils are comparatively small and do not increase or only hardly increase the distance between the correction device and the objective. The correction device can thus be mounted as near to the objective lens as possible.

These and other aspects of the invention will be apparent from and elucidated with reference to the embodiments described hereinafter. In the drawings:

FIG. 2 is a perspective view of an embodiment of a correction device for use in a particle-optical instrument in accordance with the invention;

Figure 1:
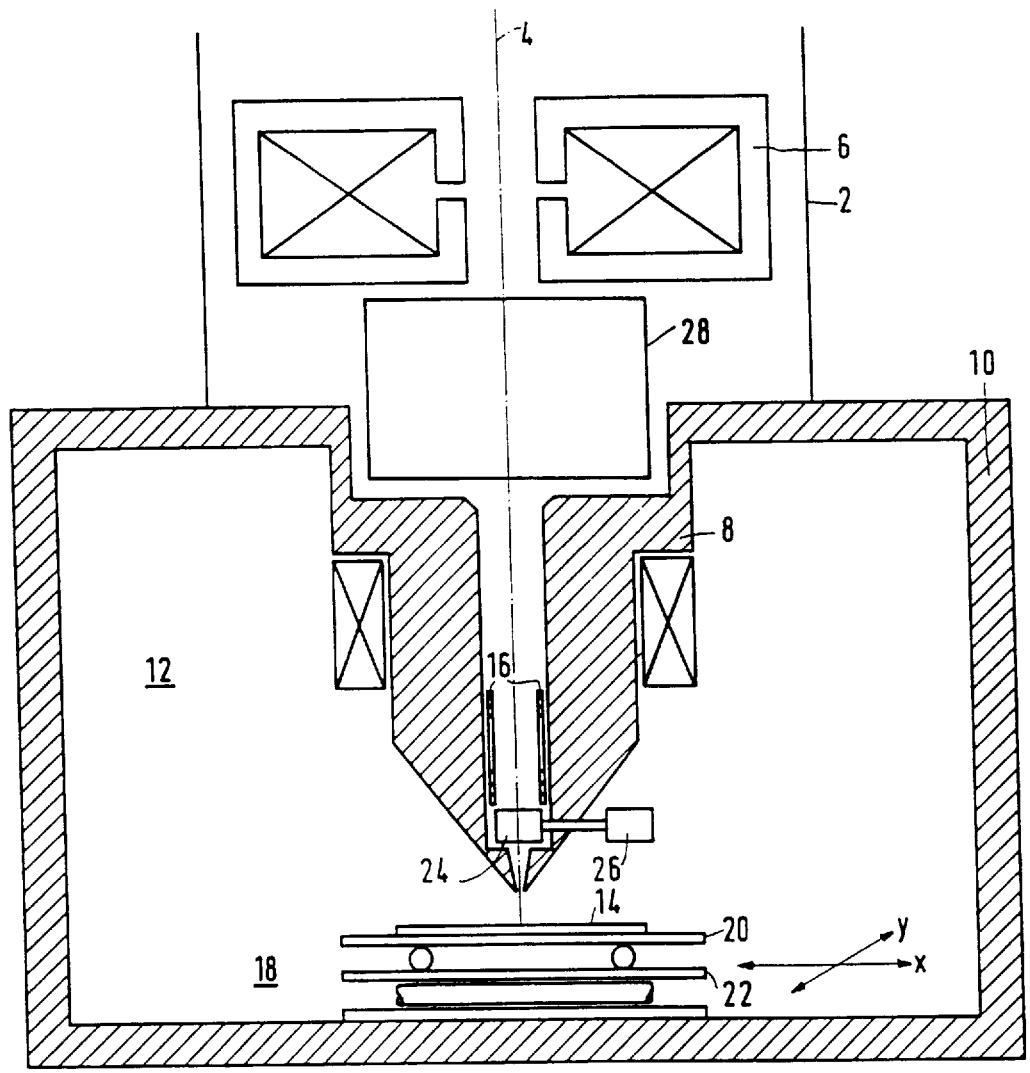
FIG. 1 shows diagrammatically a relevant part of a particle-optical instrument in which the correction device in accordance with the invention can be used.

FIG. 1 shows a particle-optical instrument in the form of a part of a column 2 of a scanning electron microscope (SEM). As is customary, an electron source (not shown in the Figure) in this instrument produces a beam of electrons which travels along the optical axis 4 of the instrument. The electron beam can traverse one or more electromagnetic lenses, such as the condenser lens 6, after which it reaches the objective lens 8. This lens, being a so-called monopole lens, forms part of a magnetic circuit which is furthermore formed by the wall 10 of the sample chamber 12. The objective lens 8 is used to form an electron beam focus whereby the sample 14 is scanned. Scanning takes place by moving the electron beam across the sample in the X-direction as well as in the Y-direction by means of scan coils 16 provided in the objective lens 8. The sample 14 is arranged on a sample table 18 which includes a carrier 20 for the x-displacement and a carrier 22 for the y-displacement. These two carriers enable selection of a desired area of the sample for examination. In this microscope imaging takes place in that from the sample secondary electrons are released which move back in the direction of the objective lens 8. The secondary electrons are detected by a detector 24 arranged in the bore of this lens. Connected to the detector is a control unit 26 for activating the detector and for converting the flow of detected electrons into a signal which can be used to form an image of the sample, for example by means of a cathode ray tube (not shown). Between the condenser 6 and the objective lens 8 there is arranged a correction device 28 which serves for the correction of the chromatic and spherical aberration of the objective lens as will be described hereinafter.

FIG. 2 is a perspective view of an embodiment of a correction device for use in a particle-optical instrument, for example as shown in FIG. 1. The correction device consists of two identical halves 31a and 31b. Because the two halves are identical, the correction device will be described hereinafter on the basis of the part 31a. Each of the two halves is formed by a magnetic circuit which consists of a cylindrical shell 32 in which a number of n poles 30-1 to 30-n are provided so as to be regularly distributed across the cylinder, n being equal to 8. For the correction of mechanical imperfections, a larger number n may be chosen, for example n=12. The cylinder axis of the shell 32 coincides with the optical axis 4 of the particle-optical instrument shown in FIG. 1.

The various multipole fields, i.e. the magnetic as well as the electrostatic fields, are generated by means of the n poles. Each of these poles is arranged to generate an electric as well as a magnetic field, the pole faces determining the multipole fields extending parallel to the optical axis of the apparatus. Each pole 30-$i$ includes an excitation coil 34-$i$ for generating a magnetic field and a pole cap 36-$i$ for generating an electric field. Each excitation coil 34-$i$ and each pole cap 36-$i$ can be individually excited, so that any desired multipole field, both electric and magnetic, can be generated by means of the 8 poles 30-1 to 30-8.

Even though in principle multipole fields of an order higher than 8 are not required for carrying out the invention, for the compensation of mechanical imperfections it is desirable to have the possibility of generating also 10-pole and 12-pole fields. This possibility, however, is not essential to the invention.

Figure 3A:
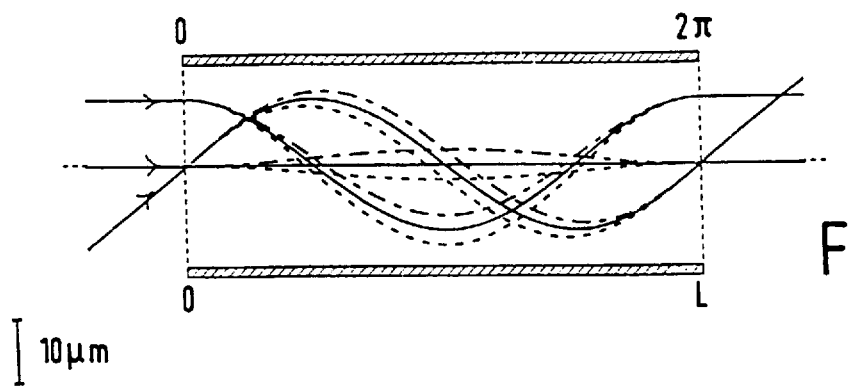
FIGS. 3a and 3b show diagrammatically the path of some electron rays, shaped as a sine with one period, in two mutually perpendicular planes in a correction device in accordance with the invention.
Figure 3B:
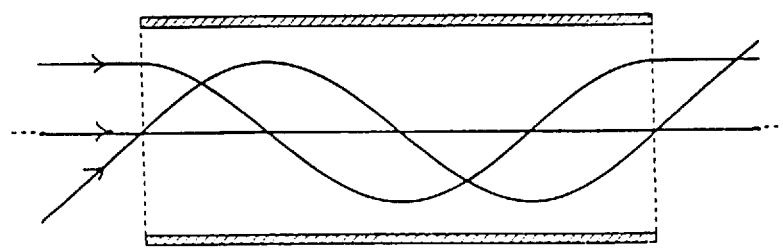

FIG. 3 shows the path of some electron rays having the shape of a sine with one period in a correction device as shown in FIG. 2. FIG. 3$a$ shows the paths in a plane through the optical axis, and FIG. 3$b$ shows the paths in a plane perpendicular to the former plane. The former plane is referred to as the x-z plane, the x-direction extending parallel to the electric field lines of the electric dipole and the z-direction being the direction of the optical axis. The solid lines represent the paths of electrons having a nominal energy of 1 keV; the dash-dot lines represent the paths of electrons whose energy deviates 0.2 eV from the nominal energy. In both figures a length of 50 mm is assumed for the poles (i.e. of the correction unit) and an inner radius of 2 mm for the boundary circle of the pole faces. (The shaded boundary faces in both figures, therefore, do not represent a boundary to scale.) In order to offer an impression of the deviations of the paths from the optical axis, a graduation stroke of 10 $\mu$m is shown in the Figures.

The x-z plane shown in FIG. 3$a$ is the symmetry plane of the electric multipoles. The magnetic multipoles extend perpendicularly to these electric multipoles. The plane extending perpendicularly to the x-z plane, i.e. the plane shown in FIG. 3$b$, is referred to as the y-z plane.

The first-order equation of the electron paths in the x-z plane according to FIG. 3$a$ is:

$$x(z) = x_0 \cos(\kappa z) + x'_0 \frac{1}{\kappa} \sin(\kappa z) + \frac{\Delta U}{U_0} \frac{\sqrt{2}}{2} \frac{1}{\kappa} [1 - \cos(\kappa z)] \quad (1)$$

whereas for the first-order equation of the electron paths in the y-z plane according to FIG. 3$b$ it holds that $$y(z) = y_0 \cos(\kappa z) + y'_0 1/\kappa \sin(\kappa z) \quad (2)$$

The symbols in the equations (1) and (2) have the following meaning:

x, y and z are the position coordinates of the relevant electron;

$x_0$ and $y_0$ are the value of x and y, respectively, at the area z=0, i.e. at the input of the correction device;

$x'_0$ and $y'_0$ are the slope in the z-direction of the path in the x-plane and the y-plane, respectively, at the area z=0;

$\Delta U$ is the deviation of the energy of the electrons from the nominal energy $U_0$, and $\kappa = (E_1 \sqrt{2})/(4U_0)$ in which $E_1$ is the coefficient of the term $-x$ in the series expansion of the electric potential to x and y.

It appears from the equations (1) and (2) that within the correction device dispersion occurs only in the x-z plane (the variable $\Delta U$ occurs only in the equation (1)), and that the y-z plane is free from dispersion.

The adjustment of the correction device, i.e. the choice of the values of the currents and voltages whereby the poles 30-$i$ (FIG. 1) are excited, is performed on the basis of the following criteria.

First of all, there is the requirement that on balance an electron of nominal energy $U_0$ may not experience deflection in the correction device. This means that an electron of nominal energy which initially follows the optical axis again travels along the optical axis after having left the correction device. This requirement is satisfied if:

$$E_1 - v_0 B_1 = 0 \quad (3)$$

The symbols in the equation (3) which have not yet been explained have the following meaning:

$B_1$ is the coefficient of the term $-y$ in the series expansion of the magnetic potential to x and y, and $V_0$ is the velocity of the electron associated with the accelerating potential $U_0$.

When the equation (3) is satisfied, being the so-called "Wien condition", the electric and the magnetic quadrupole components must be chosen so that, moreover, the condition that the behavior of the correction device in the x-z plane must be identical to that in the y-z plane is also satisfied; this is the so-called double focusing condition. This condition is:

$$E_2 - v_0 B_2 = -\frac{E_1^2}{8U_0} \quad (4)$$

The symbols in the equation (4) which have not yet been explained have the following meaning:

$E_2$ is the coefficient of the term $-(x^2-y^2)$ in the series expansion of the electric potential to x and y, and $B_2$ is the coefficient of the term $-2xy$ in the series expansion of the magnetic potential to x and y.

In order to ensure that the correction device does not exhibit dispersion from its input to its output, the last term in the equation (1), being proportional to $\Delta U/U_0$, must be equal to zero. For a correction device having a length L, this condition is satisfied if $\kappa = 2\pi/L$, or with $\kappa = (E_1\sqrt{2})/(4U_0)$:

$$E_1 = 4\pi \sqrt{2} \; \frac{U_0}{L} \quad (5)$$

The equation (5) is referred to as the $2\pi$ condition.

For correction of the chromatic aberration the condition must be satisfied that the chromatic aberration of the correction device is rotationally symmetrical and, moreover, that the chromatic aberration of the correction device opposes that of the objective to be corrected. The first condition is referred to as the condition of absence of chromatic astigmatism, and the second condition as the achromatic condition. The condition of absence of chromatic astigmatism can be written as:

$$E_3 - v_0 B_3 = -\frac{E_1^3}{32U_0^2} - \frac{E_1 E_2}{4U_0} \quad (6)$$

The symbols in the equation (6) which have not yet been explained have the following meaning:

$E_3$ is the coefficient of the term $-(x^3-3xy^2)$ in the series expansion of the electric potential to x and y, and $B_3$ is the coefficient of the term $-(3x^2y-y^3)$ in the series expansion of the magnetic potential to x and y.

The achromatic condition can be written as:

$$E_2 = \frac{E_1^2}{4U_0} \left( -1 + \frac{\sqrt{2}}{\pi} \; \frac{U_0}{E_1} \; C_{c,obj} K_{obj}^2 \right) \quad (7)$$

The symbols in this equation (7) which have not yet been explained have the following meaning:

$C_{c,obj}$ is the coefficient of chromatic aberration of the objective to be corrected; and $K_{obj}$ is the strength of the objective to be corrected; this value equals the reciprocal value of the focal distance $f_{obj}$.

For correction of the spherical aberration it is necessary to satisfy the condition that the spherical aberration of the correction device is rotationally symmetrical. This condition leads to two requirements. The first requirement is referred to as the condition of absence of axial astigmatism, and the second requirement as the condition of absence of axial star-aberration. The combination of these two requirements results in two conditions which can be written as:

$$E_3 = \frac{10E_2^2}{9E_1} - \frac{E_1^3}{72U_0^2} + \frac{E_1E_2}{36U_0} \tag{8}$$

and $$E_4 - v_0B_4 = -\frac{29}{4608} \frac{(E_1^2 + 8E_2U_0)^2}{U_0^3} \tag{9}$$

The symbols in the equation (9) which have not yet been explained have the following meaning:
$E_4$ is the coefficient of the term $-(x^4-6x^2y^2+y^4)$ in the series expansion of the electric potential to x and y, and
$B_4$ is the coefficient of the term $-(4x^3y-4xy^3)$ in the series expansion of the magnetic potential to x and y.
If the conditions for the multipole fields in conformity with the expressions (3) to (9) have been satisfied, the expression for the spherical aberration of the correction device itself is given by:

$$C_{s,corr} = -\frac{2}{3L^3} (L^2C_{c,corr}^2K_{obj}^4 - 8\pi^2LC_{c,corr}K_{obj}^2 - 8\pi^4)\frac{1}{K_{obj}^4} \tag{10}$$

The symbols in this equation (10) which have not yet been explained have the following meaning:
$C_{s,corr}$ is the coefficient of the spherical aberration of the correction device itself, and
$C_{c,corr}$ is the coefficient of chromatic aberration of the correction device itself.

In expression (10) the magnitude of the spherical aberration of the correction device itself is not sufficient to compensate the spherical aberration of the focusing lens to be corrected. This is mainly due to the fact that $LK_{obj}$ is much greater than 1. Moreover, in expression (10) the spherical aberration is not independent of the chromatic aberration of the correction device itself, so that simultaneous correction of the two aberrations of an arbitrary focusing lens is not possible. Addition of multipoles of a order higher than octupoles would not solve these problems, because such higher-order multipoles do not contribute to the correction of the spherical aberration.

The above problems are solved in accordance with the invention by splitting the correction device (at least the hexapole-section thereof) into two parts and by adding an additional hexapole $\Delta E_3$ to the first part of the original hexapole, and by subtracting an equally strong additional hexapole $\Delta E_3$ from the second part of the original hexapole. It can be demonstrated that for the coefficient of spherical aberration $C'_{s,corr}$ due to these additional hexapoles it holds that:

$$C'_{s,corr} = -\frac{15}{64\pi^2} \frac{L^3}{U_0^2} \Delta E_3^2 \frac{1}{K_{obj}^4} \tag{11}$$

For the coefficient of chromatic aberration of the correction device thus formed it holds that:

$$C_{c,cor} = -\frac{4\pi^2}{L}\left(1 + \frac{L^2}{8\pi^2U_0}E_2\right)\frac{1}{K_{obj}^4} \tag{12}$$

The appearance of the expression (12) does not deviate from that found for the correction device in which no additional hexapoles have been added to the original hexapole.

The magnitude of the additional hexapole term $\Delta E_3$ to be adjusted follows from the condition that the sum of the coefficients of spherical aberration of the correction device without the additional hexapoles (expression (10)), of an imaginary correction device having only the additional hexapoles (expression (11)), and of the focusing lens to be corrected must be equal to zero. The required magnitude for the left-hand term of the expression (11) follows therefrom, and therefrom the value of $\Delta E_3$.

The procedure for adjustment of a particle-optical apparatus including a correction device in accordance with the invention may be generally as follows:

1) An image is formed of a small object, for example a latex sphere having a diameter of the order of magnitude of 0.25 $\mu$m, with a magnification of, for example, 10.000, without the correction device being activated.

2) The axis of the quadrupoles is aligned with the optical axis by shifting, with varying quadrupole strengths $E_2$ and $B_2$, the quadrupoles and the electron beam relative to one another until image shift no longer occurs.

3) Subsequently, all multipole strengths are adjusted to their nominal values in conformity with the expressions (3) to (11).

4) $E_1$ is then adjusted so as to satisfy the $2\pi$– condition while at the same time $B_1$ is adjusted so as to satisfy the Wien condition; focusing on the object takes place via $E_1$ whereas the beam shift is minimized by adjustment of $B_1$.

5) Via $B_2$ the double focusing condition is satisfied by minimizing the astigmatism.

6) The steps 2, 4 and 5 are repeated until a final situation is reached in which said conditions are satisfied.

7) Subsequently, $E_2$ is adjusted while $E_2$-$V_0B_2$ is maintained constant for fine adjustment of the correction of the chromatic aberration. This is performed as follows: in the presence of chromatic aberration, the excitation of the focusing lens can be adjusted in such a manner that the cross-section of the electron beam is minimum. This state is referred to as focusing. On the basis of this focusing, the objective can be adjusted to slight defocusing. This slight defocusing can be canceled by changing the acceleration voltage U. It has been found that there are two values of the acceleration voltage, U+$\Delta U_1$ and U–$\Delta U_2$, for which focusing is restored. $E_2$ is then varied until $\Delta U_1 = \Delta U_2$;

8) Any three-fold residual astigmatism is removed by adjustment of the strength and orientation of the hexapole $E_3$ with defocusing of the objective. This is because this aberration becomes manifest as a triangular distortion of the circular image in the case of defocusing;

9) The additional hexapole $E_3$ is adjusted for correction of the spherical aberration. This adjustment to the nominal value is obtained by calculation of the nominal value of $E_3$ from the expression (11).

10) Any residual four-fold astigmatism is removed by adjustment of the strength and the orientation of the octupole coefficient $E_4$ with defocusing of the focusing lens. This aberration becomes manifest mainly as a square or cross-shaped distortion which has been shifted 45° between lower and upper focus in the circular image upon defocusing.

Figure 4A:
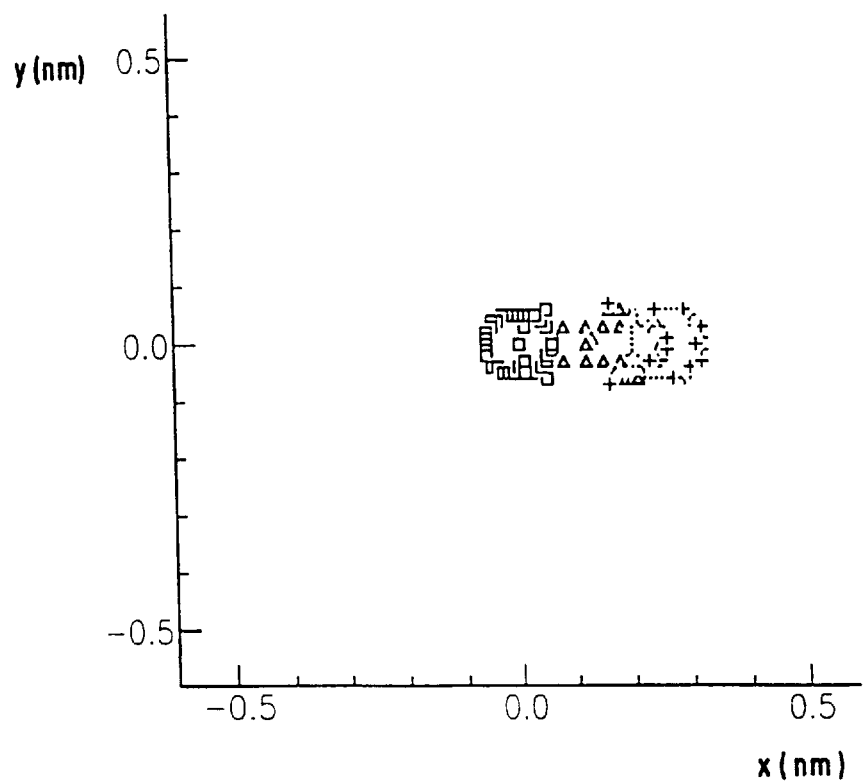
FIGS. 4a to 4c show diagrammatically some deviations in the focusing of an electron spot due to chromatic and spherical aberration, with and without using a correction device according to the invention.
Figure 4B:
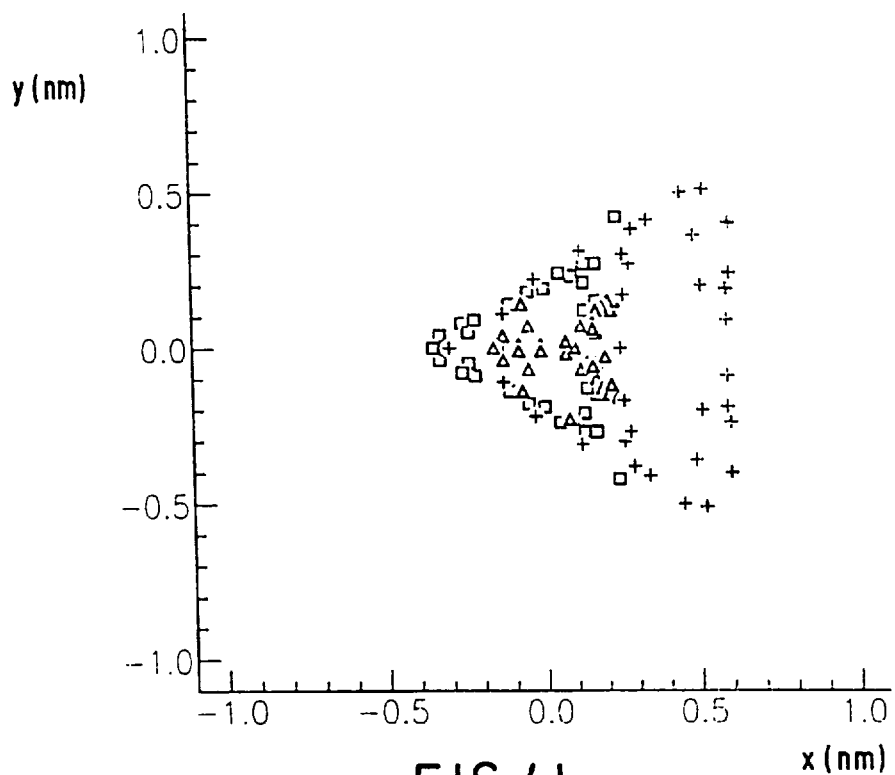
Figure 4C:
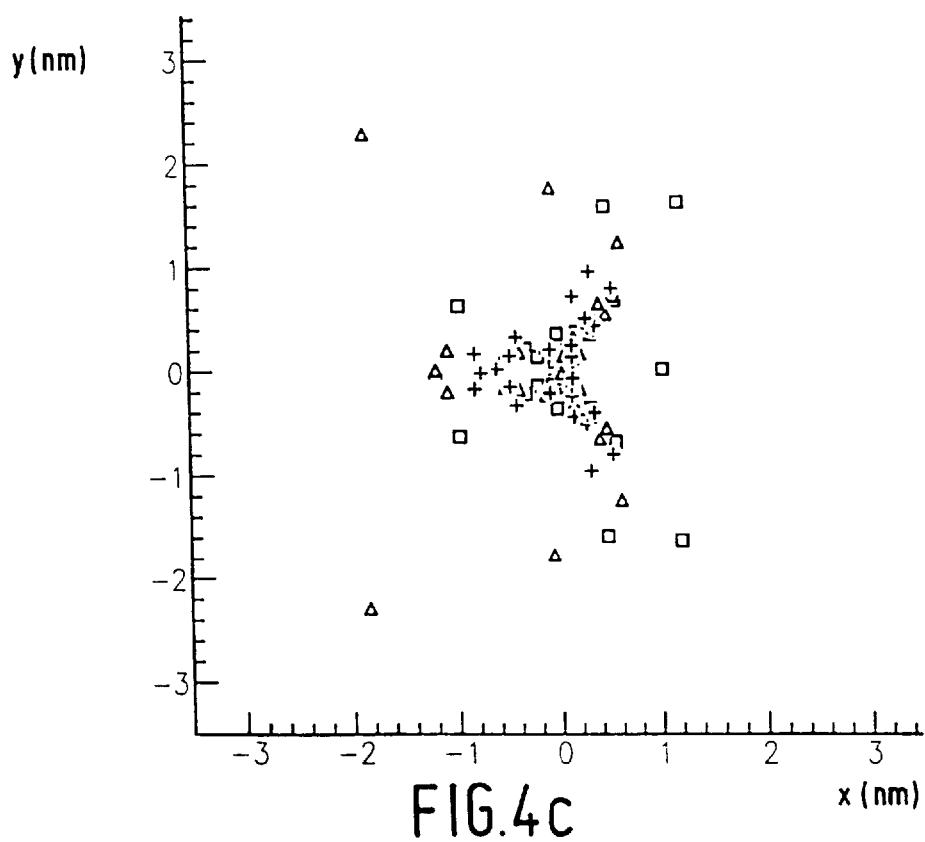

FIGS. 4a to 4c are diagrammatic representations of deviations in the focusing of an electron spot due to chromatic and spherical aberration. For these Figures a cylindrical electron beam is assumed to have an annular cross-section and a cylinder axis which is coincident with the optical axis. The radius of the cylinder equals $r_0$, where $r_0 = f\alpha$ (f=1/K is the focal distance of the focusing lens to be corrected, and $\alpha$ is the angle of aperture). The beam path in the FIGS. 4a to 4c has been obtained by computer simulation by means of a commercially available simulation program. This computer program is known as "TRC/TRASYS" and is available from Delft Technical University, Department of Applied Physics, Particle Optics Group, Delft, the Netherlands. The electric and magnetic fields used in said simulation program have been calculated by means of a number of other programs which are known as "MLD, Magnetic Lens Design", "MMD, Magnetic Multipole Design", "ELD, Electrostatic Lens Design" and "EMD, Electrostatic Multipole Design"; all of these programs are also available from said Delft Technical University.

FIG. 4a shows the cross-section of the electron beam in the paraxial image plane of a focusing lens. In this Figure the focusing lens included a correction device, but it was assumed that no spherical aberration occurred, i.e. $C_s=0$. Furthermore, the imaging parameters in this figure have the following values: $C_c=1$ mm, $f=1$ mm, $\alpha=12$ mrad, $U_0=1$ kV; the scale value in the image plane is as given along the axes in the Figure. The pixels formed by the squares represent the situation without dispersion ($\Delta U=0$); the pixels formed by the triangles represent the situation with additionally $\Delta U=0.2$ eV, and the pixels formed by the plus signs represent the situation with $\Delta U=-0.2$ eV. It appears that in this case the spot size is approximately 0.4 nm. In the same situation a non-corrected beam would have caused a spot having a diameter of 5 nm; because of the scale value, the associated pixels are not shown in the Figure.

FIG. 4b shows the cross section of the electron beam in the paraxial image plane of a focusing lens. In this Figure the focusing lens included a correction device for spherical aberration as well as chromatic aberration. The imaging parameters in this Figure have the following value: $C_c=1$ mm, $C_s=1$ mm, $f=1$ mm, $\alpha=15$ mrad, $U_0=1$ kV; the scale value in the image plane is as given in the Figure. The pixels formed by the squares represent the situation without dispersion ($\Delta U=0$); the pixels formed by the triangles represent the situation with additionally $\Delta U=0.2$ eV, and the pixels formed by the plus signs represent the situation with $\Delta U=-0.2$ eV. It appears that in this case the spot size is approximately 1 nm. A non-corrected beam would have caused a diameter of 6 nm in the same situation; because of the scale value, the associated pixels are not shown in the Figure.

FIG. 4c shows the cross-section of the electron beam in the paraxial image plane of a focusing lens. In this Figure the focusing lens included a correction device for spherical aberration, but it was assumed that no chromatic aberration occurred, i.e. $C_c=0$. Furthermore, the imaging parameters in this Figure have the following values: $C_s=10$ mm, $f=5$ mm, $\alpha=10$ mrad, $U_0=1$ kV; the scale value in the image plane is as given in the Figure. The pixels formed by the squares represent the situation without dispersion ($\Delta U=0$); the pixels formed by the triangles represent the situation with additionally $\Delta U=0.2$ eV, and the pixels formed by the plus signs represent the situation with $\Delta U=-0.2$ eV. It appears that in this case the spot size is approximately 4 nm. In the same situation a non-corrected beam would have caused a spot having a diameter of 20 nm; because of the scale value, the associated pixels are not shown in the Figure.

We claim:

1. A particle-optical apparatus, including
   a particle source for producing a beam of electrically charged particles which travel along an optical axis (4) of the apparatus in order to expose an object (14) to be irradiated in the apparatus to the particle beam,
   a focusing lens (8) for focusing the beam of electrically charged particles,
   and a correction device (28) for the correction of lens aberrations of the focusing lens (8),
   which correction device (28) includes pole faces for producing a uniform electric field and a uniform magnetic field which extends perpendicularly thereto, both dipole fields also extending perpendicularly to the optical axis (4) of the apparatus,
   which correction device also includes pole faces for producing electric and magnetic quadrupole fields, hexapole fields and an electric and/or a magnetic octupole field, said pole faces (30-i) extending substantially parallel to the optical axis (4) of the apparatus,
   and which correction device is also arranged to produce at least two additional hexapole fields which form part of said hexapole field and have been rotated 180° about the optical axis relative to one another, characterized in that
   the pole faces (30-i) which determine the additional hexapole fields are arranged adjacent one another without other particle-optical elements being arranged therebetween.

2. A particle-optical apparatus as claimed in claim 1, in which dipole fields and quadrupole fields of the correction device have a strength such that the trajectory of the electrically charged particles traveling along the optical axis of the apparatus is shaped as a sine with substantially one period.

3. A particle-optical apparatus as claimed in claim 2, in which the length of the pole faces determining a first additional hexapole field equals, viewed in the direction of the optical axis, that of the pole faces determining a second additional hexapole field.

4. A particle-optical apparatus as claimed in claim 1, which is formed as a scanning particle-optical apparatus with a spot-forming objective lens, the correction device therein being arranged so as to precede the objective lens, viewed from the particle source.

5. A correction device as defined in claim 1, constructed as a mechanically rigid unit for the correction of lens aberrations of a focusing lens in a particle-optical apparatus.

6. A particle-optical apparatus as claimed in claim 2, which is formed as a scanning particle-optical apparatus with a spot-forming objective lens, the correction device therein being arranged so as to precede the objective lens, viewed from the particle source.

7. A particle-optical apparatus as claimed in claim 3, which is formed as a scanning particle-optical apparatus with a spot-forming objective lens, the correction device therein being arranged so as to precede the objective lens, viewed from the particle source.

8. A correction device as defined in claim 2, constructed as a mechanically rigid unit for the correction of lens aberrations of a focusing lens in a particle-optical apparatus.

9. A correction device as defined in claim 3, constructed as a mechanically rigid unit for the correction of lens aberrations of a focusing lens in a particle-optical apparatus.

10. A correction device as defined in claim 4, constructed as a mechanically rigid unit for the correction of lens aberrations of a focusing lens in a particle-optical apparatus.

11. A correction device as defined in claim 6, constructed as a mechanically rigid unit for the correction of lens aberrations of a focusing lens in a particle-optical apparatus.

12. A correction device as defined in claim 7, constructed as a mechanically rigid unit for the correction of lens aberrations of a focusing lens in a particle-optical apparatus.

* * * * *